US012803275B2

(12) United States Patent
Chuang et al.

(10) Patent No.: US 12,803,275 B2
(45) Date of Patent: Nov. 17, 2026

(54) ELECTROSTATIC DISCHARGE PROTECTION CIRCUIT WITH DETECTION CIRCUIT AND DISCHARGE CIRCUIT

(71) Applicant: Vanguard International Semiconductor Corporation, Hsinchu (TW)

(72) Inventors: Chieh-Yao Chuang, Kaohsiung City (TW); Jung-Tsun Chuang, Tainan City (TW); Hsien-Feng Liao, Taichung City (TW); Ting-Yu Chang, Zhubei City (TW); Chih-Hsuan Lin, Hsinchu City (TW); Yeh-Ning Jou, Hsinchu City (TW); Shao-Chang Huang, Hsinchu City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 194 days.

(21) Appl. No.: 18/623,215

(22) Filed: Apr. 1, 2024

(65) Prior Publication Data

US 2025/0309639 A1 Oct. 2, 2025

(51) Int. Cl.
*H02H 9/04* (2006.01)
*H02H 1/00* (2006.01)
*H10D 89/60* (2025.01)

(52) U.S. Cl.
CPC .......... *H02H 9/046* (2013.01); *H02H 1/0007* (2013.01); *H10D 89/811* (2025.01)

(58) Field of Classification Search
CPC .... H02H 9/046; H02H 1/0007; H10D 89/811; H10D 89/819
See application file for complete search history.

(56) References Cited

U.S. PATENT DOCUMENTS 7,274,546 B2 * 9/2007 Gauthier, Jr. .......... H02H 9/046 361/56
9,882,376 B2 * 1/2018 Fifield .................... H02H 9/046
(Continued)

FOREIGN PATENT DOCUMENTS

| | | |
|---|---|---|
| CN | 114825303 A | 7/2022 |
| TW | 201340522 A | 10/2013 |

OTHER PUBLICATIONS

Taiwanese Office Action and Search Report for Taiwanese Application No. 113104394, dated Jan. 20, 2025.

*Primary Examiner* — Kyle J Moody
(74) *Attorney, Agent, or Firm* — Birch, Stewart, Kolasch & Birch, LLP

(57) ABSTRACT

An ESD includes a detection circuit, a P-type transistor, a N-type transistor, and a discharge circuit. The detection circuit detects whether an electrostatic discharge event occurs on a first power bonding pad to generate first and second detection signals. The first P-type transistor is coupled between the first power bonding pad and a first node and receives the first detection signal. The first N-type transistor is coupled between the first node and a second power bonding pad and receives the second detection signal. The discharge circuit is coupled between the first power bonding pad and the second power bonding pad and controlled by a control signal on the first node. In response the electrostatic discharge event occurring on the first power bonding pad, the discharge circuit provides a discharge path between the first power bonding pad and the second power bonding pad according to the control signal.

11 Claims, 6 Drawing Sheets

(56) References Cited

U.S. PATENT DOCUMENTS

| | | | | |
|---|---|---|---|---|
| 11,569,657 | B1 * | 1/2023 | Huang | H02H 1/0007 |
| 12,444,935 | B2 * | 10/2025 | Lin | H02H 9/046 |
| 2004/0125521 | A1 * | 7/2004 | Salling | H10D 89/819 361/56 |
| 2015/0295399 | A1 * | 10/2015 | Wang | H02H 9/045 361/56 |
| 2020/0035668 | A1 | 1/2020 | Savanth et al. | |
| 2020/0083704 | A1 * | 3/2020 | Huang | H10D 89/811 |
| 2021/0013714 | A1 * | 1/2021 | Huang | H02H 9/046 |
| 2022/0344930 | A1 * | 10/2022 | Sun | H02H 9/046 |
| 2025/0141220 | A1 * | 5/2025 | Lin | H02H 9/046 |

* cited by examiner

ELECTROSTATIC DISCHARGE PROTECTION CIRCUIT WITH DETECTION CIRCUIT AND DISCHARGE CIRCUIT

BACKGROUND OF THE INVENTION

Field of the Invention

The present invention relates to an electrostatic discharge protection circuit.

Description of the Related Art

With the development of semiconductor manufacturing processes for integrated circuits, the size of semiconductor components has been reduced to the sub-micron stage to improve the performance and computing speed of the integrated circuits. However, the reduction in component size has caused some reliability problems. In particular, the protection ability of integrated circuits against electrostatic discharge (ESD) is most affected. When the size of components decreases due to advanced process technology, the protection ability against electrostatic discharge also decreases a lot, which results in a significant reduction in the ESD tolerance of components. Therefore, electrostatic discharge protection circuits are required to protect components from being damaged by electrostatic discharge.

If an ESD protection circuit uses transistor components with low gate-source withstand voltages, when the ESD protection circuit receives a high supply voltage under normal operation, the transistor components may be burned due to excessive gate-source voltages, and ESD protection cannot be achieved.

BRIEF SUMMARY OF THE INVENTION

The present invention provides an exemplary embodiment of an electrostatic discharge protection circuit. The electrostatic discharge protection circuit is coupled to a first power bonding pad and comprises a detection circuit, a first P-type transistor, a first N-type transistor, and a discharge circuit. The detection circuit is coupled to the first power bonding pad. The detection circuit detects whether an electrostatic discharge event occurs on the first power bonding pad to generate a first detection signal and a second detection signal. The first P-type transistor has a first electrode coupled to the first power bonding pad, a second electrode coupled to a first node, and a control electrode receiving the first detection signal. The first N-type transistor has a first electrode coupled to the first node, a second electrode coupled to a second power bonding pad, and a control electrode receiving the second detection signal. A first control signal is generated on the first node. The discharge circuit is coupled between the first power bonding pad and the second power bonding pad and controlled by the first control signal. In response the electrostatic discharge event occurring on the first power bonding pad, the discharge circuit provides a discharge path between the first power bonding pad and the second power bonding pad according to the first control signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
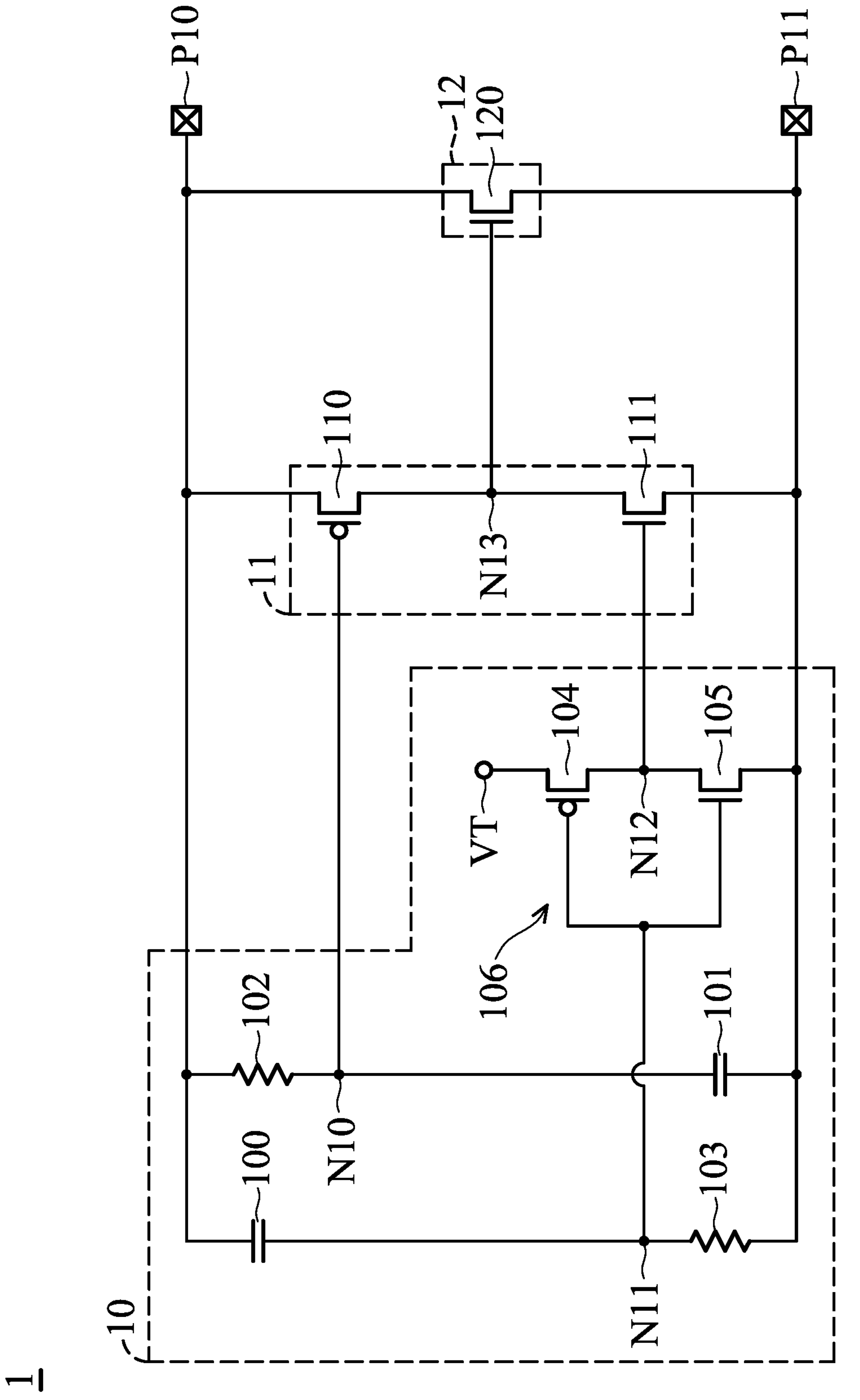
FIG. 1 shows one embodiment of an electrostatic discharge protection circuit.

FIG. 1 shows one embodiment of an electrostatic discharge (ESD) protection circuit. Referring to FIG. 1, an ESD protection circuit 1 comprises a detection circuit 10, a control circuit 11, and a discharge circuit 12. The ESD protection circuit 1 is coupled to power bonding pads P10 and P11. When the ESD protection circuit 1 operates normally in an operation mode, a high supply voltage is provided to the power bonding pad P10, and a low supply voltage is provided to the power bonding pad P11. When the ESD protection circuit 1 is not in the operation mode, the power bonding pad P10 does not receive any high supply voltage.

During the period when the ESD protection circuit 1 is not in the operation mode, the detection circuit 10 detects whether an electrostatic discharge event occurs on the power bonding pad P10. When the detection circuit 10 detects that an electrostatic discharge event occurs on the power bonding pad P10, the detection circuit 10 and the control circuit 11 operate together to control the discharge circuit 12 to provide a discharge path between the power bonding pad P10 and the power bonding pad P11 so that the electrostatic charges on the power bonding pad P10 are conducted to the power bonding pad P11 through the discharge path. Thus, the components coupled to the power bonding pad P10 are not damaged by the electrostatic charges. The circuit structure of the ESD protection circuit 1 will be described in the following paragraphs.

Referring to FIG. 1, the detection circuit 10 comprises capacitors 100 and 101, resistors 102 and 103, and an inverter 106. The capacitor 100 is coupled between power bonding pad P10 and a node N11. The resistor 103 is coupled between the node N11 and the power bonding pad P11. The resistor 102 is coupled between power bonding pad P10 and a node N10. The capacitor 101 is coupled between the node N10 and the power bonding pad P11.

The inverter 106 is coupled between a power terminal VT and the power bonding pad P11. The input terminal of the inverter 106 is coupled to the node N11, and the output terminal thereof is coupled to a node N12. The inverter 106 determines the voltage level of the node N12 according to the voltage level of the signal on the node N11 so that the voltage level of the node N12 is equal to or close to the voltage level of the power terminal VT or the voltage level of the power bonding pad P11. Referring to FIG. 1, the inverter 106 comprises a P-type transistor 104 and an N-type transistor 105. A first terminal of the P-type transistor 104 is coupled to the power terminal VT, a second electrode thereof is coupled to the node N12, and a control electrode thereof is coupled to the node N11 (that is, the control electrode of the P-type transistor 104 is coupled to the input terminal of the inverter 106). A first electrode of the N-type transistor 105 is coupled to the node N12, a second electrode thereof is coupled to the power bonding pad P11, and a control electrode thereof is coupled to the node N11 (that is, the control electrode of the N-type transistor 105 is coupled to the input terminal of the inverter 106). In the embodiment, the P-type transistor 104 is implemented by a P-type metal-oxide-semiconductor (PMOS) transistor, and the N-type transistor 105 is implemented by an N-type metal-oxide-semiconductor (NMOS) transistor. The control electrode, the first electrode, and the second electrode of the P-type transistor 104 correspond to the gate, the source, and the drain of the PMOS transistor respectively. The control electrode, first electrode, and second electrode of the N-type transistor 105 correspond to the gate, drain, and source of the NMOS transistor respectively.

Referring to FIG. 1, the control circuit 11 comprises a P-type transistor 110 and an N-type transistor 111. A first electrode of the P-type transistor 110 is coupled to the power bonding pad P10, a second electrode thereof is coupled to a node N13, and a control electrode thereof is coupled to the detection circuit 10 at the node N10. A first electrode of the N-type transistor 111 is coupled to the node N13, the second electrode thereof 111 is coupled to the power bonding pad P11, and a control electrode thereof is coupled to the detection circuit 10 at the node N12. In the embodiment, the P-type transistor 110 is implemented by a PMOS transistor, and the N-type transistor 111 is implemented by an NMOS transistor. The control electrode, first electrode, and second electrode of the P-type transistor 110 correspond to the gate, source, and drain of the PMOS transistor respectively. The control electrode, first electrode, and second electrode of the N-type transistor 111 correspond to the gate, drain, and source of the NMOS transistor respectively.

The discharge circuit 12 comprises an N-type transistor 120. A first electrode of the N-type transistor 111 is coupled to the power bonding pad P10, a second electrode thereof is coupled to the power bonding pad P11, and a control electrode thereof is coupled to the control circuit 11 at the node N13. In the embodiment, the N-type transistor 120 is implemented by an NMOS transistor. The control electrode, first electrode, and second electrode of the N-type transistor 120 correspond to the gate, drain, and source of the NMOS transistor respectively.

The operation of the ESD protection circuit 1 will be explained in detail through the following paragraphs and FIG. 2 to FIG. 4.

Figure 2:
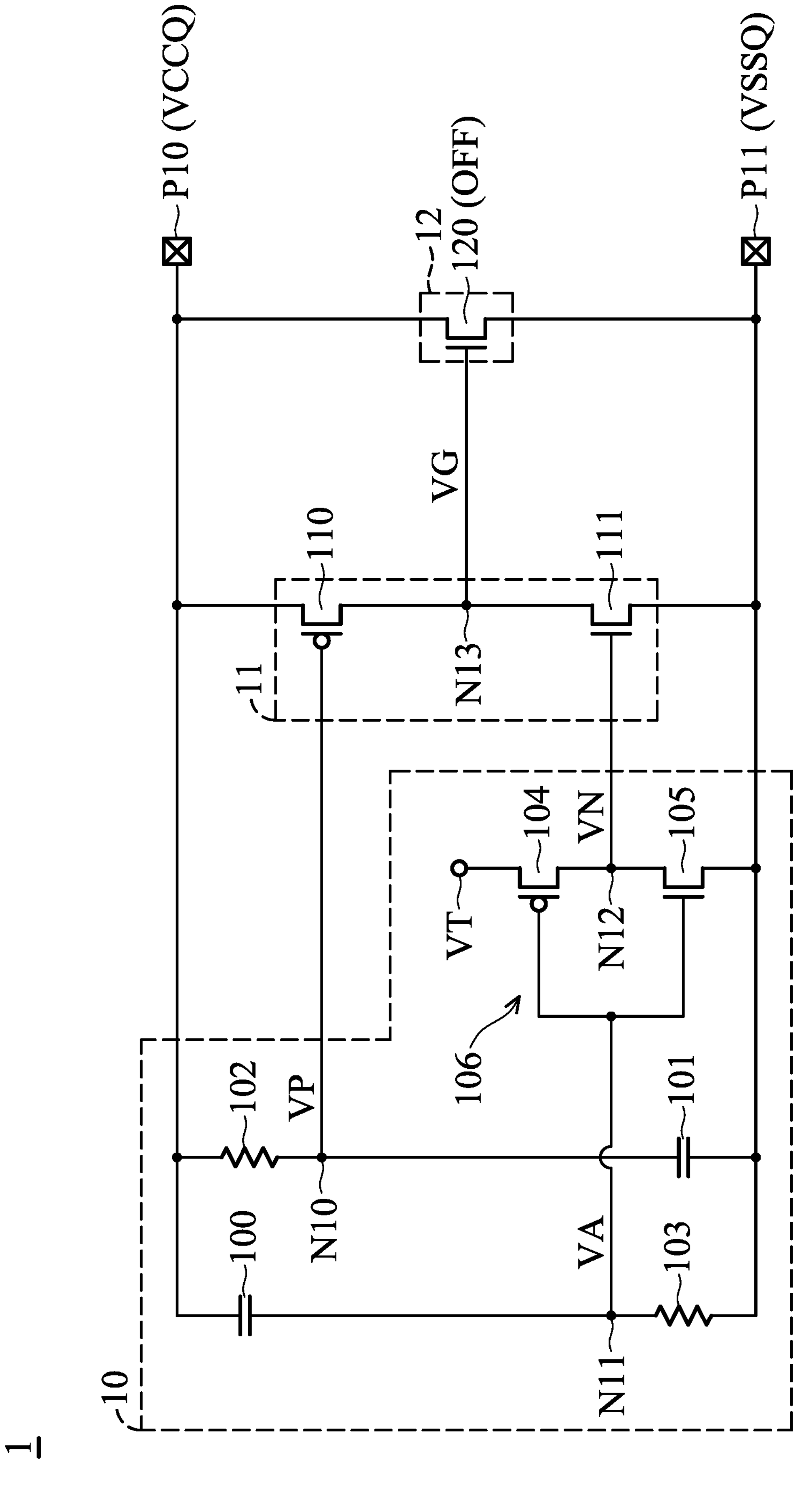
FIG. 2 is a schematic diagram showing an operation of the electrostatic discharge protection circuit in FIG. 1 in an operation mode.
Figure 3:
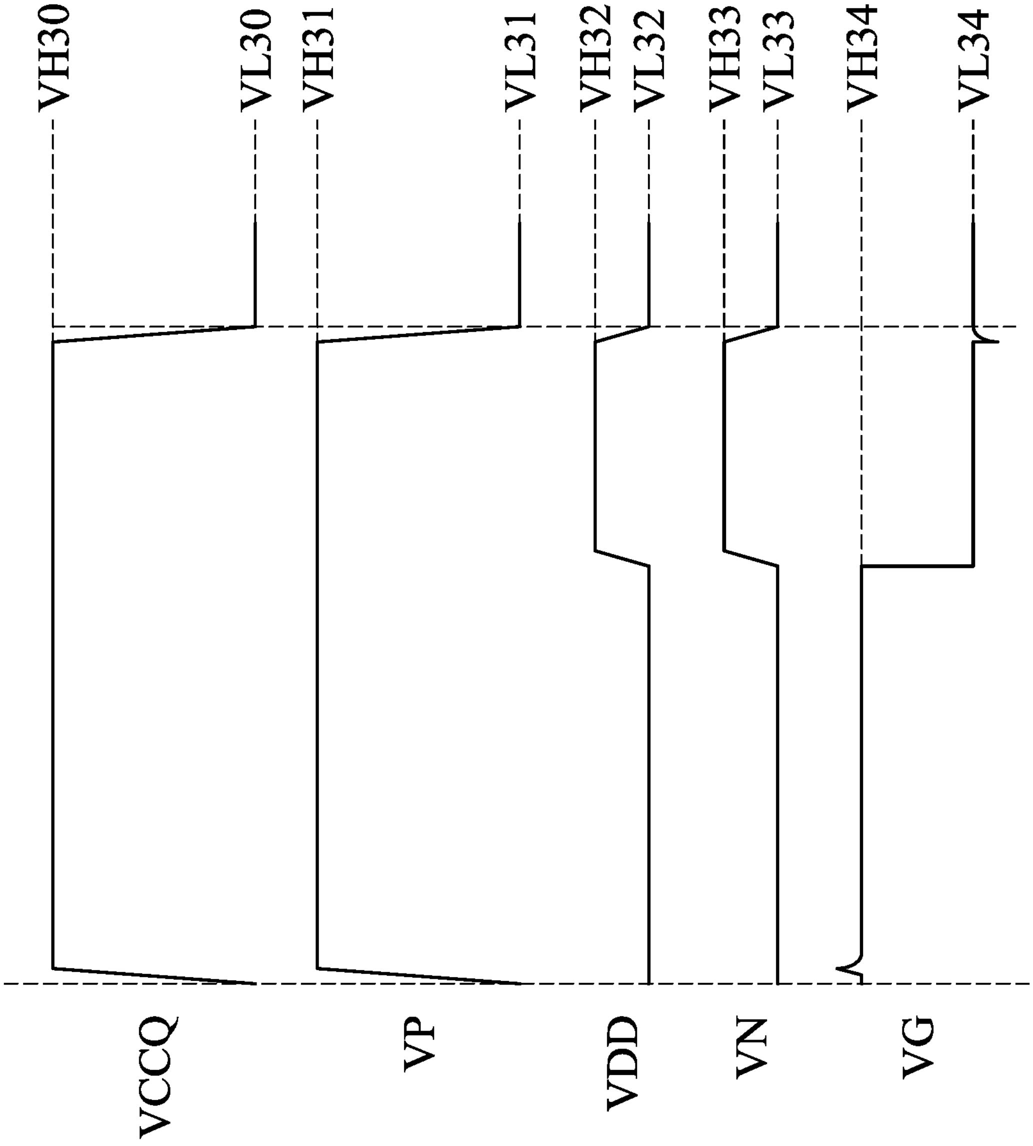
FIG. 3 is a schematic diagram showing variations of main signals/voltage of the electrostatic discharge protection circuit in FIG. 1 in the operation mode.

Referring to FIG. 2 and FIG. 3, when the ESD protection circuit 1 is in the operation mode, a supply voltage VCCQ is provided to the power bonding pad P10, and a supply voltage VDD is provided to the power terminal VT. In the operation mode, the supply voltage VCCQ increases from a voltage level VL30, such as 0V, to a supply level VH30, and the supply voltage VDD increases from a voltage level VL32, such as 0V, to a supply level VH32. In some cases, the supply voltage VCCQ reaches the supply level VH30, and simultaneously, the supply voltage VDD also reaches the power supply level VH32. In other cases, as shown in FIG. 3, the supply voltage VCCQ reaches the supply level VH30 first, and the supply voltage VDD reaches the supply level VH32 after a period of time, that is, the time when the supply voltage VDD reaches the supply level VH32 is later than the time when the supply voltage VCCQ reaches the supply level VH30. In the embodiment, the supply level VH30 of the supply voltage VCCQ is higher than the supply level VH32 of the supply voltage VDD. For example, the supply level VH30 is 30 volts (V), while the supply level VH32 is 5V.

In the embodiment, the power bonding pad P11 is coupled to a ground. In the case, the supply voltage VSSQ is a ground voltage, such as 0V.

The operation of the ESD protection circuit 1 of the embodiment will be described in the following paragraphs with the case that the time when the supply voltage VDD reaches the supply level VH32 later than the time when the supply voltage VCCQ reaches the supply level VH30.

Referring to FIG. 2 and FIG. 3, when the supply voltage VCCQ increases to the supply level VH30 (30V) from the voltage level VL30 (0V), a detection signal VP on the node N10 increases to a voltage level VH31 from a voltage level VL31 with the increment of the supply voltage VCCQ. In the embodiment, the voltage VL31 is 0V, and the voltage level VH31 is approximately 30V. Based on the voltage level VH31 of the detection signal VP, the PMOS transistor 110 is turned off. At this time, based on the resistance value of the resistor 103 and the supply voltage VSSQ of 0V, the detection signal VA on the node N11 has a low voltage level to turn on the PMOS transistor 104 and turn off the NMOS transistor 105.

Based on the turned-on state of the PMOS transistor 104, the detection signal VN on the node N12 is equal to the supply voltage VDD, that is, the detection signal VN varies with the supply voltage VDD. As shown in FIG. 3, after a period of time starting from the time when the supply voltage VCCQ reaches the supply level VH30, the detection signal VN increases to a voltage level VH33 of 5V from a voltage level VL33 of 0V with the supply voltage VDD. Referring to FIG. 2 and FIG. 3, when the detection signal VN is at the voltage level VL33 of 0V, the NMOS transistor 111 is turned off. At this time, both of the PMOS transistor 110 and the NMOS transistor 111 are turned off. According to the respective equivalent impedances of the PMOS transistor 110 and the NMOS transistor 111, a voltage dividing operation is performed on the voltage difference between the supply voltages VCCQ and VSSQ so that the control signal VG on the node N13 has a voltage level VH34, for example, 1.2V. Based on the relatively low voltage level VH34 of the control signal VG, the NMOS transistor 120 is turned off.

When the detection signal VN increases to the voltage level VH33 of 5V from the voltage level VL33, the NMOS transistor 111 is turned on. Based on the turned-on state of the NMOS transistor 111, the control signal VG changes to a voltage level VL34 of 0V from the voltage level VH34. Based on the control signal VG of 0V, the NMOS transistor 120 is turned off.

According to the above, when the ESD protection circuit 1 is in the operation mode, the detection circuit 10 generates the detection signals VP and VN according to the supply voltages VCCQ and VSSQ to respectively control the on/off states of the PMOS transistor 110 and the NMOS transistor 111, thereby generating the control signal VG. The NMOS transistor 120 is turned off (OFF) according to the control signal VG. In this case, the discharge circuit 12 does not provide a discharge path for electrostatic discharge protection.

In the embodiment, referring to FIG. 2, through the operation of the detection circuit 10 in the operation mode, the gate-source voltage of the PMOS transistor 110 is equal to the difference between the voltage level of the detection signal VP and the level of the supply voltage VCCQ, and the gate-source voltage of the NMOS transistor 111 is equal to the difference between the voltage level of the detection signal VN and the level of the supply voltage VSSQ, and the gate-source voltage of the NMOS transistor 120 is equal to the difference between the voltage level of the control signal VG and the level of the supply voltage VSSQ. Referring to FIG. 3, the gate-source voltage of the PMOS transistor 110 is equal to or close to 0V, the gate-source voltage of the NMOS transistor 111 is equal to 0V or 5V, and the gate-source voltage of the NMOS transistor 120 is equal to 1.2V or 0V. Therefore, when the ESD protection circuit 1 uses transistors with low gate-source withstand voltages to implement the transistors 110, 111, and 120 and the supply level VH30 of the supply voltage VCCQ is high in the operation mode, the respective gate-source voltages of the transistors 110, 111, and 120 are relatively less, thereby preventing the transistors 110, 111, and 120 from being burned.

Figure 4:
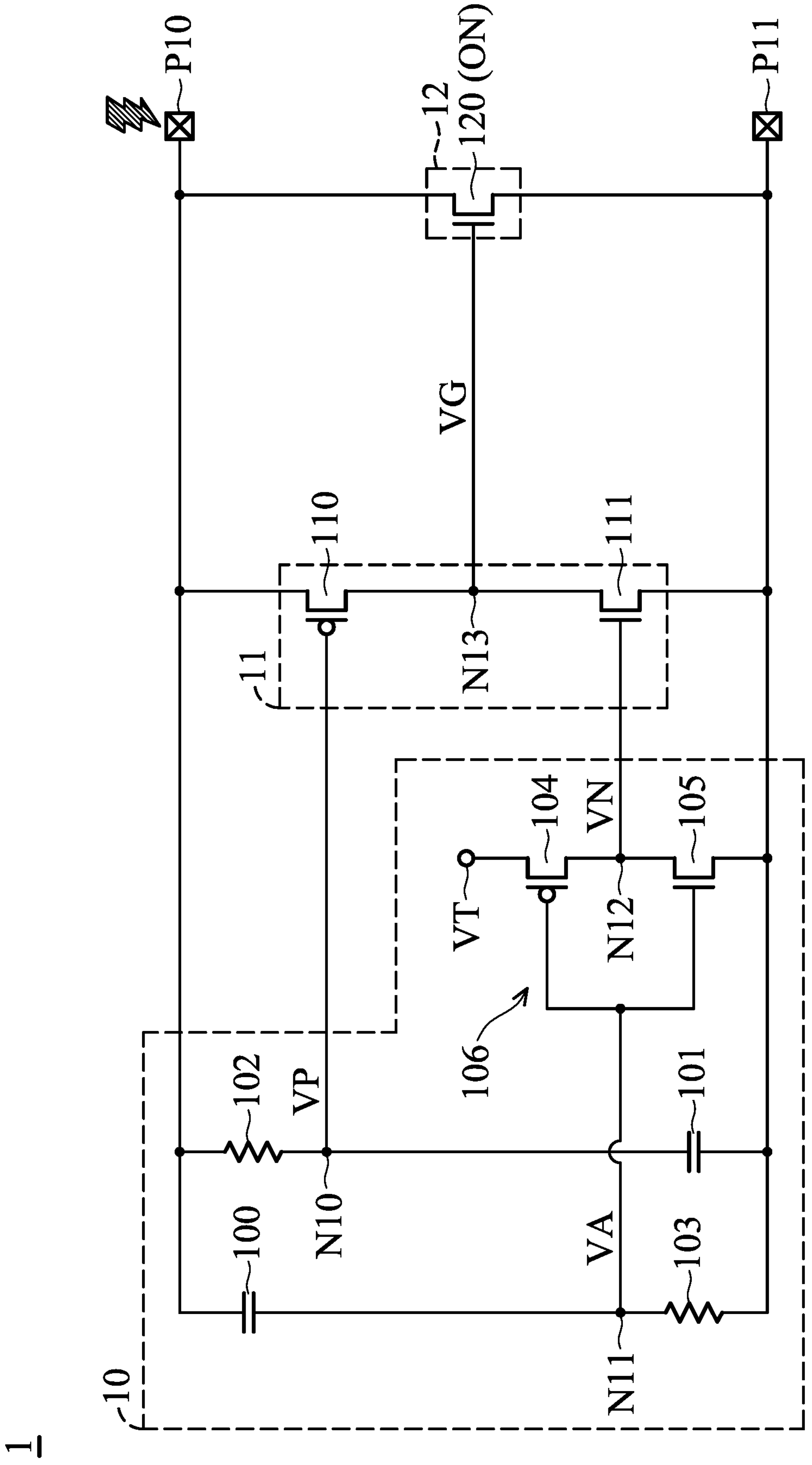
FIG. 4 is a schematic diagram showing an operation of the electrostatic discharge protection circuit in FIG. 1 when an electrostatic discharge event occurs.

Referring to FIG. 4, when the ESD protection circuit 1 is not in the operation mode, the power bonding pad P10 does not receive the supply voltage VCCQ, and the voltage source VT does not receive the supply voltage VDD. When an electrostatic discharge event occurs on the power bonding pad P10, the voltage on the power bonding pad P10 increases instantaneously. At this time, based on the component characteristics of the capacitor 101, the detection signal VP on the node N10 has a low voltage level to turn on the PMOS transistor 110. Moreover, at this time, based on the component characteristics of the capacitor 100, the voltage level of the detection signal VA increases instantaneously with the instantaneously increased voltage on the power bonding pad P10 to turn off the PMOS transistor 104 and turn on the NMOS transistor 105. Based on the turned-on state of the NMOS transistor 105, the detection signal VN has a low voltage level to turn off the NMOS transistor 111.

At this time, since the PMOS transistor 110 is turned on and the NMOS transistor 111 is turned off, the voltage level of the control signal VG on the node N13 increases instantaneously with the instantaneously increased voltage on the power bonding pad P10 to turn on the NMOS transistor 120. Due to the turned-on state (ON) of the NMOS transistor 120, a discharge path is formed between the power bonding pads P10 and P11 so that the electrostatic charges on the power bonding pad P10 are conducted to the power bonding pad P11 through this discharge path, thereby preventing the components coupled to the power bonding pad P10 from being damaged by the electrostatic charges.

Figure 5:
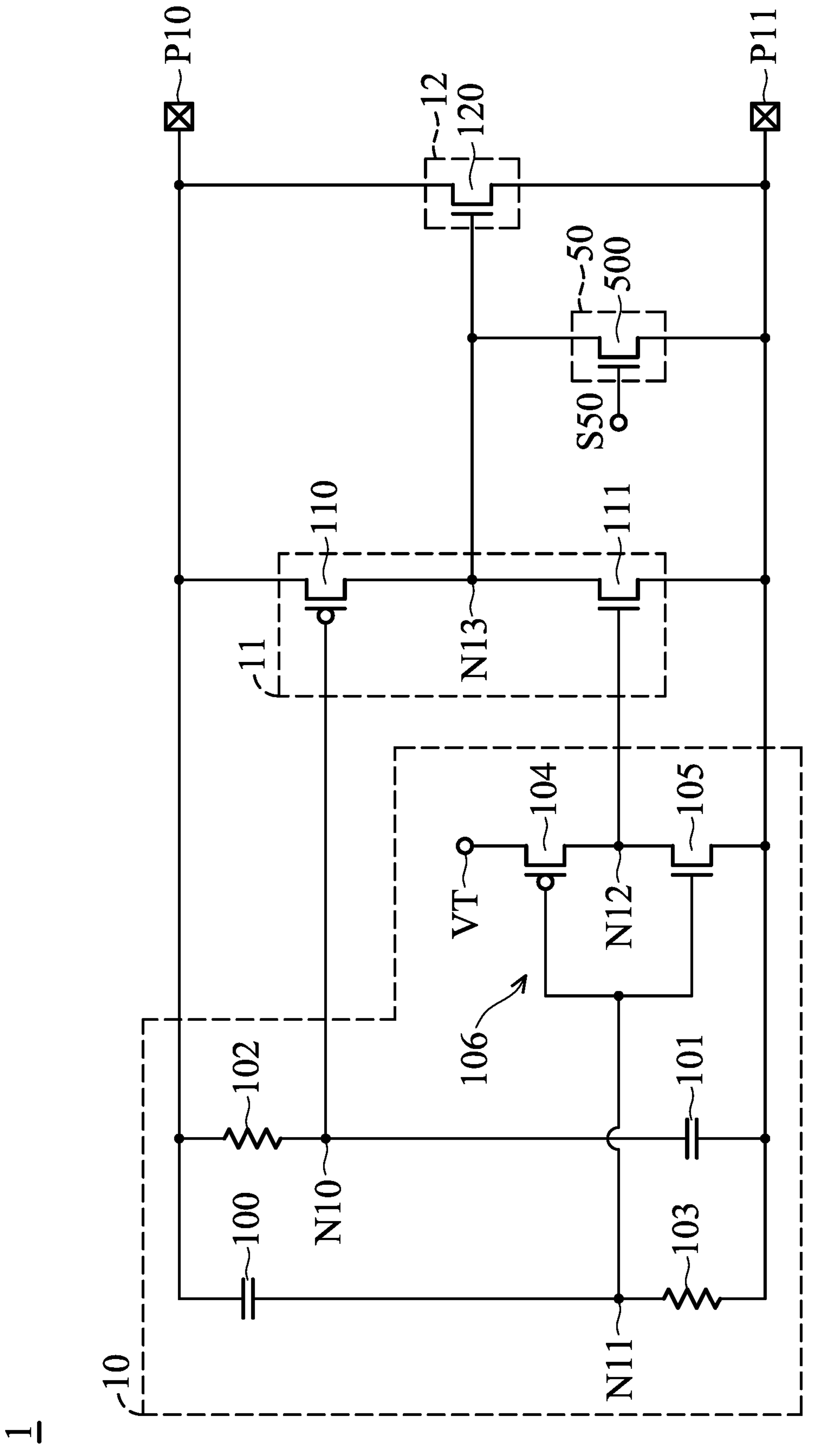
FIG. 5 shows another embodiment of an electrostatic discharge protection circuit according.

FIG. 5 shows another embodiment of an electrostatic discharge protection circuit. Referring to FIG. 5, the ESD protection circuit 1 further comprises a power state control circuit 50. The power state control circuit 50 is coupled between the node N13 and the power pad P11 and is controlled by a control signal S50. In the embodiment, in the operation mode, the control signal S50 indicates whether the supply voltage VCCQ reaches the supply level VH30.

Referring to FIG. 5, the power state control circuit 50 comprises an N-type transistor 500. A first electrode of the N-type transistor 500 is coupled to the node N13, a second electrode thereof is coupled to the power bonding pad P11, and a control electrode thereof receives the control signal S50. In the embodiment, the N-type transistor 500 is implemented by an NMOS transistor. The control electrode, first electrode, and second electrode of the N-type transistor 500 correspond to the gate, drain, and source of the NMOS transistor respectively.

Figure 6:
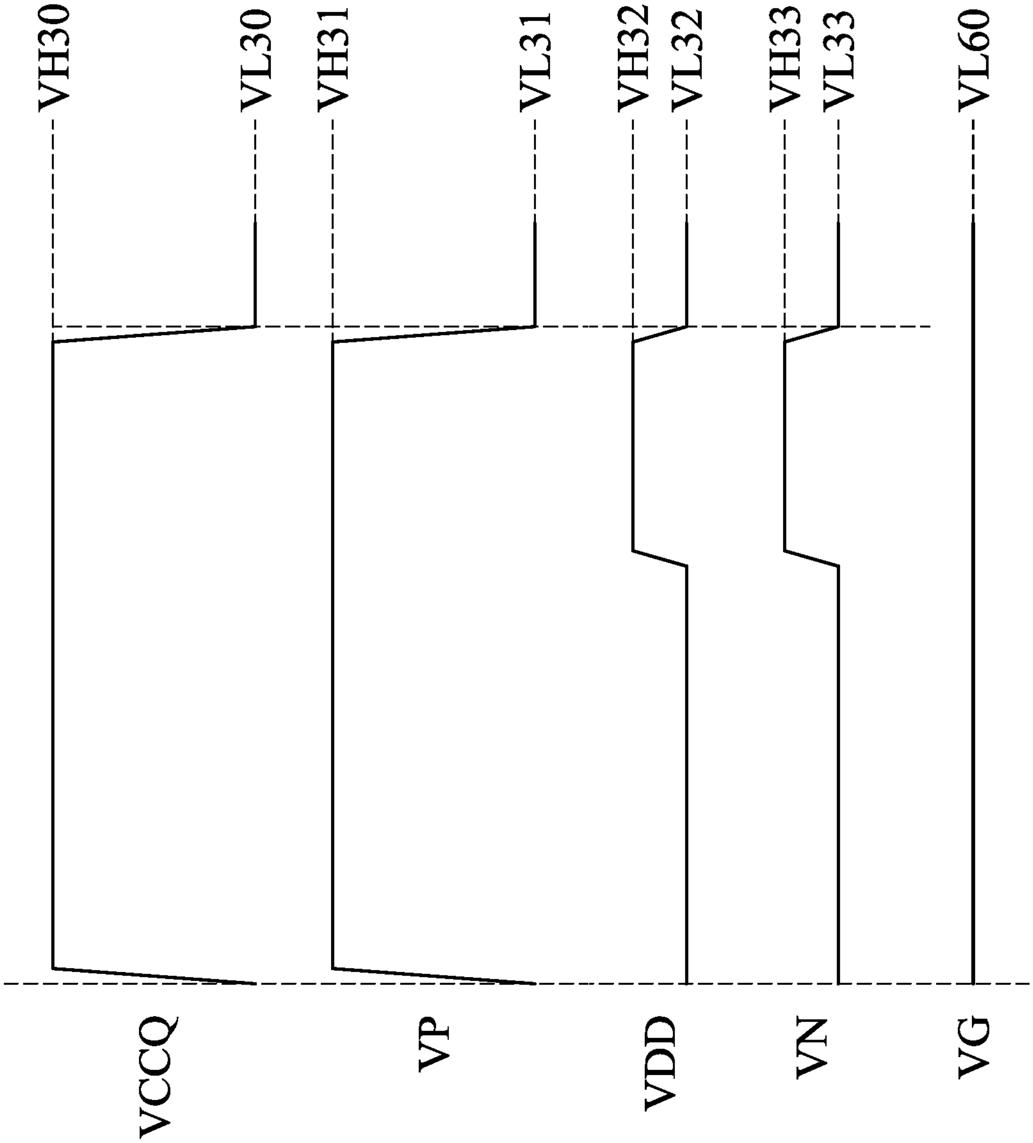
FIG. 6 is a schematic diagram showing variations of main signals/voltage changes of the electrostatic discharge protection circuit in FIG. 5 in an operation mode.

In the embodiment of FIG. 5, the circuit structure and operation of the detection circuit 10 and the control circuit 11 are provided with the related descriptions of FIG. 2 to FIG. 4, and the description related to the detection circuit 10 and the control circuit 11 in FIG. 5 is omitted here. The operation of the power state control circuit 50 will be described below through FIG. 5 and FIG. 6.

In the operation mode, when the supply voltage VDD is at the voltage level VL32 of 0V but has not yet reached the supply level VH32, the control signal S50 has a high voltage level to turn on the NMOS transistor 500. At this time, based on the turned-on stage of the NMOS transistor 111, the control signal VG on the node N13 is at a voltage level VL60 of 0V to turn off the NMOS transistor 120.

When the supply voltage VDD increases to the supply level VH32 from the voltage level VL32, the control signal S50 is switched to have a low voltage level to turn off the NMOS transistor 500. At this time, since the detection signal VN increases to the voltage level VH33 of 5V from the voltage level VL33 with the supply voltage VDD to turn on the NMOS transistor 111, the control signal VG is still at the voltage level VL60 of 0V to turn off the NMOS transistor 120.

According to the above description, through the operation of the power state control circuit 50 based on the control signal S50, during the operation mode, the control signal VG can be stably maintained at the voltage level VL60 of 0V so that the NMOS transistor 120 is fully turned off, which reduces the leakage current flowing the NMOS transistor 120 from power bonding pad P10 to the power bonding pad P11.

When the ESD protection circuit 1 of FIG. 5 is not in the operation mode, the gate of the NMOS transistor 500 does not receive the control signal S50 so that the voltage level on the gate of the NMOS transistor 500 is unknown. When an electrostatic discharge event occurs on the power bonding pad P10, the detection circuit 10 and the control circuit 11 operate together to generate the control signal VG to turn on the NMOS transistor 120. Therefore, a discharge path is formed between the power bonding pads P10 and P11 so that the electrostatic charges on the power bonding pad P10 are conducted to the power bonding pad P11 through the discharge path, thereby preventing the components coupled to the power bonding pad P10 from being damaged by the electrostatic charges. The operations of the detection circuit 10, the control circuit 11, and the discharge circuit 12 are provided with the relevant descriptions in FIG. 2 to FIG. 4, and the description related to the detection circuit 10, the control circuit 11, and the discharge circuit 12 is omitted here.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection circuit coupled to a first power bonding pad, comprises:

a detection circuit, coupled to the first power bonding pad, detecting whether an electrostatic discharge event occurs on the first power bonding pad to generate a first detection signal and a second detection signal;

a first P-type transistor having a first electrode coupled to the first power bonding pad, a second electrode coupled to a first node, and a control electrode receiving the first detection signal;

a first N-type transistor having a first electrode coupled to the first node, a second electrode coupled to a second power bonding pad, and a control electrode receiving the second detection signal which is different from the first detection signal, wherein a first control signal is generated on the first node; and a discharge circuit coupled between the first power bonding pad and the second power bonding pad and controlled by the first control signal, wherein in response the electrostatic discharge event occurring on the first power bonding pad, the discharge circuit provides a discharge path between the first power bonding pad and the second power bonding pad according to the first control signal, wherein the detection circuit comprises:

a first resistor coupled between the first power bonding pad and a second node;

a first capacitor coupled between the second node and the second power bonding pad;

a second capacitor coupled between the first power bonding pad and a third node;

a second resistor coupled between the third node and the second power bonding pad; and an inverter circuit coupled between a power terminal and the second power bonding pad, wherein the first detection signal is generated at the second node, and the inverter circuit generates the second detection signal.

2. The electrostatic discharge protection circuit as claimed in claim 1, wherein the inverter circuit comprises:

a second P-type transistor having a first electrode coupled to the power terminal, a second electrode coupled to a fourth node, and a control electrode coupled to the third node; and a second N-type transistor having a first electrode coupled to the fourth node, a second electrode coupled to the second power bonding pad, and a control electrode coupled to the third node, wherein the second detection signal is generated on the fourth node.

3. The electrostatic discharge protection circuit as claimed in claim 2, wherein the discharge circuit comprises:

a third N-type transistor having a first electrode coupled to the first power bonding pad, a second electrode coupled to the second power bonding pad, and a control terminal coupled to the first node.

4. The electrostatic discharge protection circuit as claimed in claim 2, further comprising:

a power state control circuit coupled between the first node and the second power bonding pad and controlled by a second control signal, wherein the power state control circuit determines whether a conductive path is provided between the first node and the second power bonding pad according to the second control signal.

5. The electrostatic discharge protection circuit as claimed in claim 4, wherein:

in response to the electrostatic discharge protection circuit operating in an operation mode, the power terminal receives a supply voltage, and in the operation mode, in response to that the supply voltage has not reached a supply level, the power state control circuit provides the conductive path between the first node and the second power bonding pad according to the second control signal.

6. The electrostatic discharge protection circuit as claimed in claim 4, wherein:

in response to the electrostatic discharge protection circuit operating in an operation mode, the power terminal receives a first supply voltage, and the first power bonding pad receives a second supply voltage, in the operation mode, time when the first supply voltage reaches a first supply level is later than time when the second supply voltage reaches a second supply level, and in the operation mode, in response to that the first supply voltage has not reached the first supply level, the power state control circuit provides the conduction path between the first node and the second power bonding pad according to the second control signal.

7. The electrostatic discharge protection circuit as claimed in claim 6, wherein the first power supply level is lower than the second power supply level.

8. An electrostatic discharge protection circuit coupled to a first power bonding pad, comprises:

a detection circuit, coupled to the first power bonding pad, detecting whether an electrostatic discharge event occurs on the first power bonding pad to generate a first detection signal and a second detection signal;

a first P-type transistor having a first electrode coupled to the first power bonding pad, a second electrode coupled to a first node, and a control electrode receiving the first detection signal;

a first N-type transistor having a first electrode coupled to the first node, a second electrode coupled to a second power bonding pad, and a control electrode receiving the second detection signal which is different from the first detection signal, wherein a first control signal is generated on the first node;

a discharge circuit coupled between the first power bonding pad and the second power bonding pad and controlled by the first control signal; and a power state control circuit coupled between the first node and the second power bonding pad and controlled by a second control signal, wherein in response the electrostatic discharge event occurring on the first power bonding pad, the discharge circuit provides a discharge path between the first power bonding pad and the second power bonding pad according to the first control signal, wherein the power state control circuit determines whether a conductive path is provided between the first node and the second power bonding pad according to the second control signal.

9. The electrostatic discharge protection circuit as claimed in claim 8, wherein:

in response to the electrostatic discharge protection circuit operating in an operation mode, the detection circuit receives a first supply voltage, the first power bonding pad receives a second supply voltage, and the detection circuit generates the second detection signal according to the first supply voltage and the second supply voltage, and in the operation mode, in response to that the first supply voltage has not reached the first supply level, the power state control circuit provides the conduction path between the first node and the second power bonding pad according to the second control signal.

10. The electrostatic discharge protection circuit as claimed in claim 9, wherein in the operation mode, time when the first supply voltage reaches the first power level is later than time when the second supply voltage reaches a second power level.

11. The electrostatic discharge protection circuit as claimed in claim 10, wherein the first power supply level is lower than the second power supply level.

* * * * *